United States Patent [19]

Dorey et al.

[11] 4,250,407
[45] Feb. 10, 1981

[54] MULTI FUNCTION PATCH PIN CIRCUIT

[75] Inventors: Howard A. Dorey, Godalming; Edward A. Martin, Church Crookham; Michael I. Spooner, Aldershot, all of England

[73] Assignee: The Solartron Electronic Group Limited, Farnborough, England

[21] Appl. No.: 854,282

[22] Filed: Nov. 23, 1977

[30] Foreign Application Priority Data

Nov. 26, 1976 [GB] United Kingdom ............. 49505/76

[51] Int. Cl.³ .................. H03K 10/082; H03K 17/62; H03K 5/153
[52] U.S. Cl. ................................ 307/209; 307/254; 307/361
[58] Field of Search ............... 307/203, 209, 213, 361, 307/254

[56] References Cited

U.S. PATENT DOCUMENTS

| 3,155,845 | 11/1964 | Gruddis et al. | 307/209 |
| 3,207,922 | 9/1965 | Gruddis et al. | 307/209 |
| 3,609,411 | 9/1971 | Ma et al. | 307/251 X |
| 3,660,677 | 5/1972 | Maley et al. | 307/209 |
| 3,660,678 | 5/1972 | Maley et al. | 307/209 |
| 3,671,763 | 6/1972 | Maley et al. | 307/209 |
| 3,969,633 | 7/1976 | Paluck et al. | 307/209 X |

FOREIGN PATENT DOCUMENTS

| 1250778 | 10/1971 | United Kingdom . |
| 1289799 | 9/1972 | United Kingdom . |
| 516195 | 6/1976 | U.S.S.R. | 307/209 |

OTHER PUBLICATIONS

Lindgren et al., "Three-State Receiver Logical Circuit", *IBM Tech. Discl. Bull.*, vol. 19, No. 2, pp. 661-662, 7/1976.
Miller, "A Non-Synchronous Computer Circuit", *RCA Technical Notes*, TN No. 562, 3 sheets, 3/1964.

*Primary Examiner*—Larry N. Anagnos
*Attorney, Agent, or Firm*—Joseph J. Kaliko; Mikio Ishimaru; Dale V. Gaudier

[57] ABSTRACT

A single patch on an integrated circuit is arranged to patch any one of four different logical states into the circuit, according to whether the pin is grounded, floating, coupled to a supply rail via a resistor, or coupled to the supply rail directly. In one embodiment, the voltage thresholds of three transistors are arranged so that they switch on successively in response to successively higher voltages on the patch pin, thereby controlling the binary logic signals at each of two output points in the circuit; in the other embodiment, multi-emitter transistors are arranged with differing current thresholds to achieve the same result.

8 Claims, 2 Drawing Figures

MULTI FUNCTION PATCH PIN CIRCUIT

The present invention relates to integrated circuits and is concerned with the provision of patching facilities whereby one or more external pins of an integrated circuit can be externally patched to different voltage levels to patch in, for example, the address or function mode of the circuit. The patched information can be regarded as a binary word of which the number of bits is determined by the amount of information which has to be patched in. It is well known to provide patch pins which are connected either to ground or to another voltage. This other voltage will be positive or negative, depending upon the rail voltage polarity employed in the integrated circuit. It is clear that each pin thereby provides a single bit of information and that there must be as many pins assigned to patching as there are bits in the binary word constituting the patched information.

Designers of complex digital integrated circuits frequently encounter the problem of pin limitation, that is to say the limit on the number of pins which can be employed in practice (without purchasing expensive circuits with non-standard packages) proves to impose a severe restraint on circuit design. At present, the largest standard package has 40 pins which have to be allocated between the voltage supply requirements of the circuit, the logical inputs and outputs and the patch inputs, and 40 pins can well prove to be too few. For example, we have described in our co-pending British patent application No. 29375/76 and U.S. Pat. No. 4,150,438 an integrated circuit whose requirements come to 43 pins, of which 7 are patch pins.

The object of the present invention is to provide an integrated circuit in which each patch pin can provide two bits of information. This enables the number of patch pins to be halved so that, in the example given above, the 7 patch pins are reduced to 4 and the total number of pins comes down from 43 to the allowable figure of 40. For convenience the invention will be defined and described in terms of a single patch pin since application of the invention to more than one pin involves mere replication of the circuit and possibly decoding of the pairs of bits provided from each pin. Such decoding does not form part of the present invention.

In view of the fact that assignment of bit values is always an arbitrary choice it will also be convenient to denote binary words by expressions such as AABB with the understanding that AABB must represent either 0011 or 1100 and that this choice is in general independent of the choice made for any other binary word.

According to the present invention in its broadest aspect, there is provided an integrated circuit having an external pin connected to an internal circuit formed of a plurality of interconnected semiconductor devices with thresholds such that, when the pin is at four different voltage levels, bit levels provided at a first point of the internal circuit follow one of the sequences ABBA, AABB and ABAB and bit levels provided at a second point of the internal circuit follow a different one of the said sequences ABBA, AABB and ABAB.

As will be apparent from the two embodiments described below it is relatively straightforward to derive the said two sequences but with the fourth bit of one of the sequences wrong. However, it is also relatively straightforward to derive a third sequence AAAB and to form a logical combination such that the fourth bit of the wrong sequence is corrected. This is done in both embodiments.

Further according to the present invention there is provided an integrated circuit having an external pin connected to an internal circuit formed of a plurality of interconnected semiconductor devices including first, second and third devices provided with different thresholds and a logical circuit, the thresholds of the first, second and third devices provided with different thresholds and a logical circuit, the thresholds of the first, second and third devices being such that, when the pin is at four different voltage levels, corresponding bit levels provided by the first device are A, B, B and B, by the second device are A, A, B and B, and by the third device follow A, A, A and B and the logical circuit being arranged to combine the respective bit levels A, B. B and B with the respective bit levels A, A, A and B to form respective bit levels A, B. B and A.

The bit sequences A, B. B.A. and A. A. B. B. can be used as two bit words which have four different values corresponding to the four different voltage levels as shown by the following table:

TABLE 1

| Pin Voltage level or patch number | Two bit word | | Alternative realizations of two bit word | | | |
|---|---|---|---|---|---|---|
| 1 | A | A | 00 | 01 | 10 | 11 |
| 2 | A | B | 01 | 00 | 11 | 10 |
| 3 | B | B | 11 | 10 | 01 | 00 |
| 4 | B | A | 10 | 11 | 00 | 01 |

It will be understood that the binary words in Table 1 to which the foregoing interpretation of words such as A A B B applies, are the two columnwise four-bit words A A B B and A B B A. In the first of the four realizations we have A=0 and B=1 for both the four-bit words, in the second realization A=0 and B=1 for the first four-bit word but A=1 and B=0 for the second four-bit word, and so on.

For convenience in patching it is preferably arranged that the four pin voltage levels are determined as follows:

Patch 1—Pin grounded
Patch 2—Pin floating
Patch 3—Pin connected to V through a resistor.
Patch 4—Pin connected direct to V.

V will be either a positive or a negative small voltage. Externally of the integrated circuit it is, therefore, only necessary to provide appropriately connected pins for patches 1, 3 and 4 and the resistor used in patch 3.

As will be shown below the different thresholds may be established either as voltage thresholds or as current thresholds.

The invention will be described in more detail, by way of example, with reference to the accompanying drawings, in which.

Figure 1:
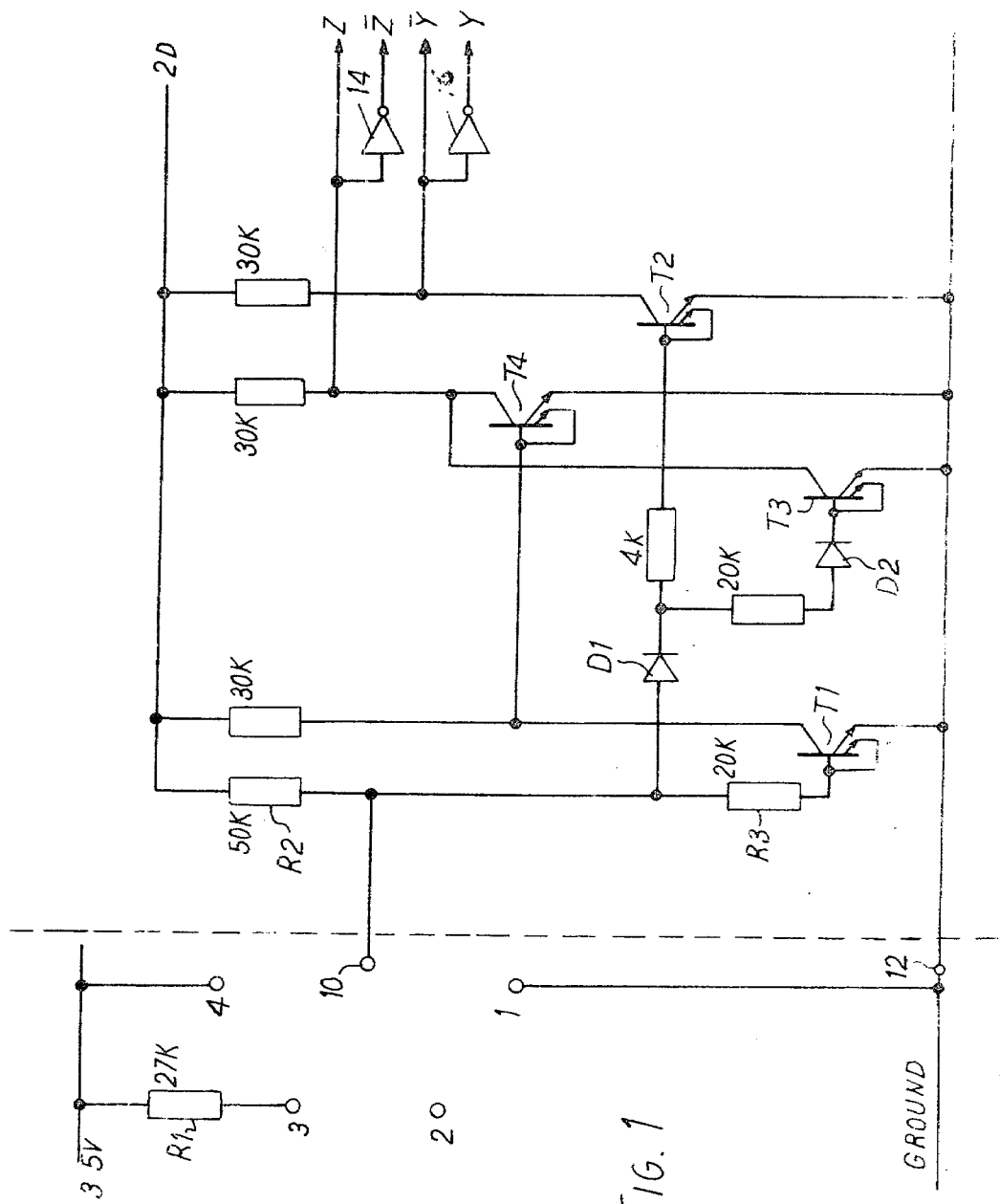
FIG. 1 is a circuit diagram of the preferred embodiment of the invention.

Referring to FIG. 1, the circuit to the right of the broken line is included on an integrated circuit chip and is connected to one external pin 10 of the integrated circuit. Off the chip there are provided four terminals labelled 1 to 4 in accordance with their patch numbers. Terminal 1 is connected to signal ground which is conventionally connected to a further pin 12 of the integrated circuit. Terminal 2 is a floating terminal and can, in practice, be omitted. Terminal 3 is connected to +3.5 V through a resistor RI while terminal 4 is connected direct to +3.5 V. On the chip is a circuit comprising four NPN transistors all operating in common emitter configuration between a positive voltage 2D and ground. The voltage 2D is available on the chip as the drop across two diodes and is thus about +1.4 V. The construction of the circuit will be fully apparent from the drawing and the following description of operation.

It can be seen that T1, T2 and T3 are driven in parallel from the terminal 10 but that the connection to the base of T2 includes a single diode D1 while the connection to the base of T3 includes the diode D1 in series with another diode D2. The thresholds for turning on T1, T2 and T3 therefore form an ascending series. Moreover a bias resistor chain R2, R3 to the base of T1 is such that, when terminal 10 is floating, transistor T1 turns on but transistors T2 and T3 remain off. Transistor T4 is coupled to T1 as an inverter stage. Furthermore, the collectors of T3 and T4 are connected together to provide a wired-OR logic function. If either T3 or T4 conducts, the collector voltage will be pulled down near to 0 V.

In patch 1 terminal 10 is at 0 V and T1, T2 and T3 are biased OFF. T1 turns T4 ON. In patch 2, as already explained, T1 is ON while T2 and T3 remain OFF; T1 turns T4 OFF. In patch 3 the voltage on terminal 10 is sufficient to turn ON T2 as well as T1; T3 remains OFF and T1 turns T4 OFF. In patch 4 the voltage on terminal 10 is sufficient to turn on all of T1, T2 and T3 and T1 again turns T4 OFF.

The states of the transistors can alternatively be represented as 0 and 1, 0 corresponding to ON (collector near 0 V) and 1 corresponding to OFF (collector near to 2D). The values of complementary pairs of outputs Z, $\overline{Z}$, Y, $\overline{Y}$ can be similarly represented where Z is the wired OR of T3 and T4 (Z=1 if T3=T4=1 and Z=0 if T3 or T4=0), $\overline{Z}$ is provided by an inverter 14, $\overline{Y}$ is identical with T2 and Y is provided from $\overline{Y}$ by another inverter 16. The states of the circuit can now be completely characterised as follows:

TABLE 2

| Patch Number | T1 | T2 | T3 | T4 | Y | $\overline{Y}$ | Z | $\overline{Z}$ |
|---|---|---|---|---|---|---|---|---|
| 1 | 1 | 1 | 1 | 0 | 0 | 1 | 0 | 1 |
| 2 | 0 | 1 | 1 | 1 | 0 | 1 | 1 | 0 |
| 3 | 0 | 0 | 1 | 1 | 1 | 0 | 1 | 0 |
| 4 | 0 | 0 | 0 | 1 | 1 | 0 | 0 | 1 |

The circuit therefore provides two bit output words YZ which comply with the first of the four alternative realizations given in Table 1. The complementary words $\overline{Y}$ $\overline{Z}$ are also provided with correspond with the fourth alternative realization. If it should happen that the second realization is required by the ensuing logic, it is available as Y$\overline{Z}$ while the third realization of Table 1 is $\overline{Y}$Z.

Figure 2:
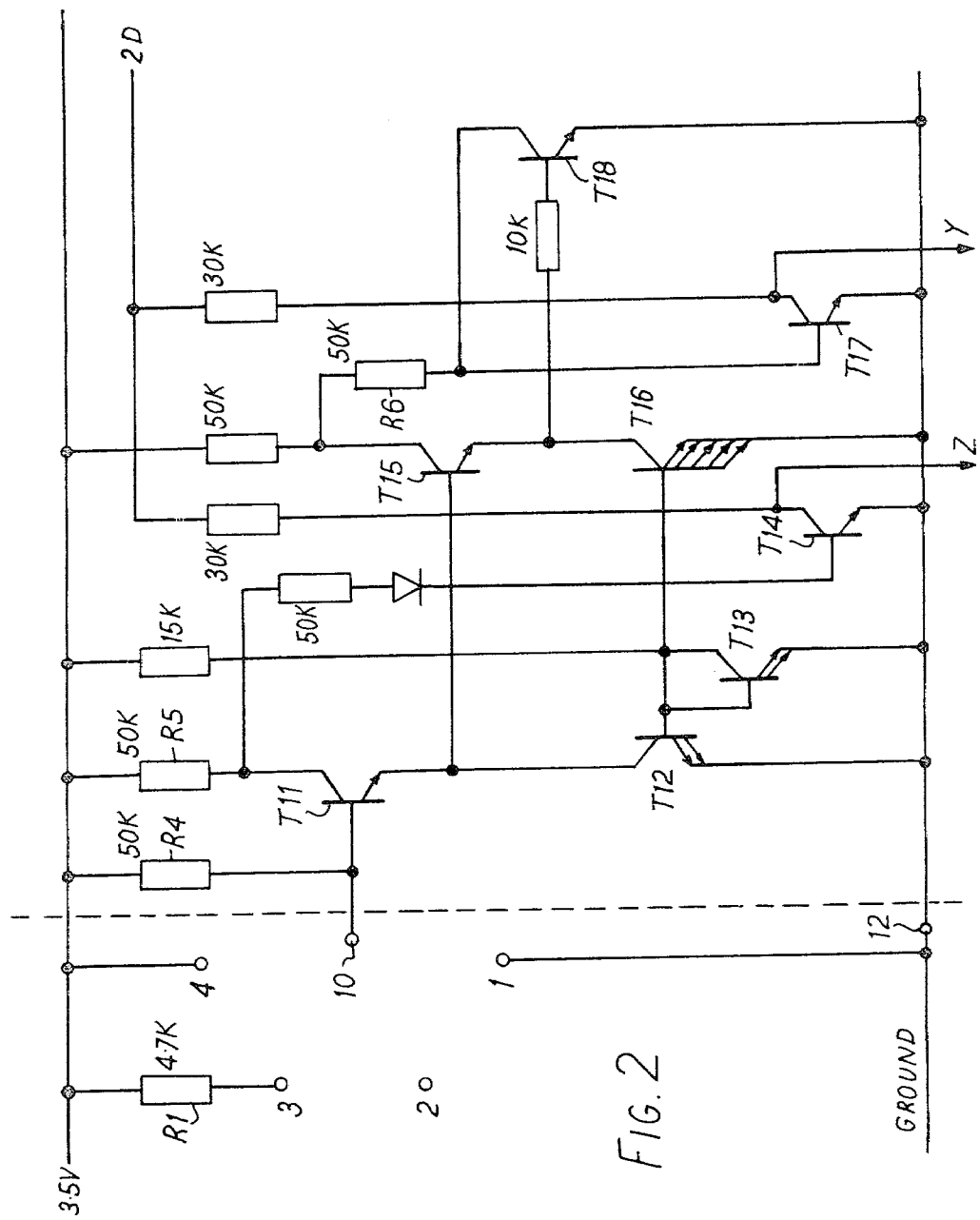
FIG. 2 is a circuit diagram of an alternative embodiment.

In the alternative embodiment shown in FIG. 2, the off-chip circuit to the left of the broken line is the same (apart from the value of R1) as in FIG. 1. The circuit on the chip now has its states determined by current thresholds. Again construction is apparent from the drawing taken in conjunction with the following description of operation.

T13 has its base and collector connected together and, therefore, operates as a diode drawing a fixed bias current determined by the 15K collector resistor and thereby establishing a predetermined voltage bias on the bases of T12 and T16. When T12 and T16 are permitted to conduct, i.e. when T11 and T15 conduct, they operate as current mirrors passing currents determined by the said voltage bias and the ratio of their emitter areas to that of T13. T12 and T13 both have double emitters while T16 has five emitters so that the said ratio is 2½:1.

Patch 1, pin 10 at ground, T11 is OFF. T12 is conductive, with its collector near to ground potential, but is unable to draw the current it wants because T11 is OFF. This state of T12, namely conductive but not conducting, will be called NO CURRENT. The low collector potential of T12 puts T15 OFF and T16, like T12, is NO CURRENT. The low collector potential of T16 puts T18 OFF. T14 and T17 are turned ON by T11 and T15 respectively so that we have Y=0, Z=0 where Y and Z are taken from the collectors of T17 and T14 respectively.

Patch 2, pin 10 floating. T11 is turned On by bias resistor R4 and T12 (a double emitter transistor) absorbs substantially all the emitter current of T11. T15 is, therefore, not turned ON by T11. T14 is turned OFF by T11. T16 remains NO CURRENT, T1 remains ON and T18 remains OFF. We now have Y=0, Z=1.

Patch 3, pin 10 connected to 3.5 V through R1. T11 is turned ON harder and now turns T15 ON. T12 remains ON and T16 now turns ON. The heavy drain formed by T16 (a multi-emitter transistor) prevents T18 from being turned ON by current from the emitter of T15. T14 and T17 are both turned OFF, by T11 and T15 respectively, so that we have Y=1, Z=1.

Patch 4, pin 10 connected direct to 3.5 V. The base of T11 is now held at 3.5 V (there is no base resistor corresponding to R3 of FIG. 1) and T11 is so highly conductive that all its electrodes are at substantially this potential notwithstanding the presence of the collector resistor R5. The high collector potential of T11 turns T14 ON again so that Z reverts to 0. The high emitter potential of T11 also tends to cause T15 to act in the same way as T11, which would turn t17 ON and put Y=0, whereas proper completion of the truth table requires Y=1. It is for this reason that T18 is provided. T18 now turns ON, notwithstanding the current drawn by T16 and the low collector potential of T18, isolated from the collector of T15 by R6, forces T17 to stay OFF so that Y=1 is achieved. If $\overline{Y}$ and $\overline{Z}$ are required, they can be provided by means of inverters.

In summary, T11 and T14 provide the bit sequence 0 1 1 0. In the absence of T18, T15 and T17 would provide the sequence 0 0 1 0 but T18 is used to force this to the sequence 0 0 1 1 so that the final result is:

| Patch Number | Y | Z |
|---|---|---|
| 1 | 0 | 0 |
| 2 | 0 | 1 |
| 3 | 1 | 1 |
| 4 | 1 | 0 |

This is the same result as FIG. 1 which is, however, preferred to FIG. 2 because the circuit of FIG. 1 is considerably simpler.

Although the described embodiments arrive at the sequences ABBA and AABB, these are not the only possibilities. The pairs of sequences may be any of the three tabulated below:

| First point: | ABBA | ABBA | ABAB |
| --- | --- | --- | --- |
| Second point: | AABB | ABAB | AABB |

We claim:

1. An integrated circuit having external pins including at least one patch pin arranged to receive a patching signal to patch data into said circuit and two further pins arranged to be coupled to respective voltage supply rails; and internal circuit means comprising an input, means coupling said input to said patch pin, first and second outputs, means for establishing a first predetermined operative level at said input in the absence of connection to said patch pin, and a plurality of interconnected semiconductor devices having respective predetermined first, second and third operative thresholds which are intermediate two respective operative levels each established at said input by coupling of said patch pin to a respective one of said supply rails, said first threshold being the closest of said thresholds to one of said two operative levels, said second threshold being the closest of said thresholds to the other of said two operative levels, and said third threshold being between said first and second thresholds and also being the only one of said thresholds between said first predetermined operative level and a second predetermined operative level established at said input by connection of said patch pin via resistance means to a predetermined one of said supply rails, said semiconductor devices coupling said input to said outputs such that, for each of said operative levels established at said input as aforesaid, said circuit means supplies a respective and different combination of binary digit levels at said outputs.

2. An integrated circuit according to claim 1, wherein the semiconductor devices have different voltage thresholds.

3. An integrated circuit according to claim 1, wherein the semiconductor devices have different current thresholds.

4. An integrated circuit according to claim 1, in combination with a plurality of pins to which said patch pin is selectively connectible, a first of said pins being at ground potential, a second of said pins being at a floating potential, a third of said pins being coupled to said predetermined voltage supply rail via resistance means, and a fourth of said pins being coupled to said predetermined voltage supply rail directly, the other of said supply rails being at ground potential.

5. An integrated circuit having external pins including at least one patch pin arranged to receive a patching signal to patch data into said circuit; and internal circuit means comprising an input, means coupling said input to said patch pin, first, second and third interconnected semi-conductor devices having respective and different predetermined operative thresholds and responsive to the voltage at said input such that, for each of four different voltage levels applied to said patch pin, said first device supplies respective binary digit levels A, B, B and B, said second device supplies respective binary digit levels A, A, B and B, and said third device supplies respective binary digit levels A, A, A and B, and logical circuit means responsive to said first and third devices to combine the respective binary digit levels A, B, B and B with the respective binary digit levels A, A, A and B to form respective binary digit levels A, B, B and A.

6. An integrated circuit according to claim 5, wherein said operative thresholds of said first to third devices are in ascending series.

7. An integrated circuit according to claim 5, wherein the logical circuit means comprises inverter means responsive to said first device to invert the digit levels therefrom, and OR-function means responsive to said inverter means and said third device to combine the digit levels therefrom.

8. An integrated circuit according to claim 5, wherein said devices are transistors in common-emitter configuration.

* * * * *